United States Patent
Wu

(10) Patent No.: US 11,281,318 B2
(45) Date of Patent: Mar. 22, 2022

(54) DISPLAY DEVICE WITH RECESSES

(71) Applicant: Innolux Corporation, Miao-Li County (TW)

(72) Inventor: Yuan-Lin Wu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/697,086

(22) Filed: Nov. 26, 2019

(65) Prior Publication Data

US 2020/0097114 A1 Mar. 26, 2020

Related U.S. Application Data

(63) Continuation of application No. 15/480,383, filed on Apr. 6, 2017, now abandoned.

(Continued)

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13338* (2013.01); *G02F 1/133345* (2013.01); *G06F 3/0443* (2019.05); *H01L 25/167* (2013.01); *H01L 27/1218* (2013.01); *H01L 27/1248* (2013.01); *G06F 3/0446* (2019.05); *G06F 2203/04102* (2013.01); *G06F 2203/04103* (2013.01)

(58) Field of Classification Search
CPC ...... G06F 3/044; G06F 3/0412; G06F 1/1643; G06F 1/169; G06F 1/1652; H01L 27/1244; G09G 3/3208
See application file for complete search history.

(56) References Cited

U.S. PATENT DOCUMENTS

| 2012/0062447 | A1* | 3/2012 | Tseng | G02F 1/136286 |
| | | | | 345/33 |
| 2013/0148312 | A1* | 6/2013 | Han | H05K 1/028 |
| | | | | 361/736 |

(Continued)

FOREIGN PATENT DOCUMENTS

| CN | 104701342 | 6/2015 |
| CN | 105977275 | 9/2016 |

OTHER PUBLICATIONS

"Office Action of China Counterpart Application", dated Mar. 27, 2020, p. 1-p. 8.

*Primary Examiner* — Yuzhen Shen
(74) *Attorney, Agent, or Firm* — JCIPRNET

(57) ABSTRACT

The disclosure relates to a display device, including a substrate, a driving structure layer, a display structure layer and a touch layer. The substrate includes a bending area and a main area adjacent to the bending area. The driving structure layer is disposed on the substrate. The driving structure layer includes an insulating structure, and the insulating structure includes a plurality of recesses. The display structure layer is disposed on the driving structure layer. The touch layer is disposed on the driving structure layer. A portion of the touch layer is disposed on the bending area of the substrate. At least a part of the plurality of recesses is disposed on the bending area of the substrate.

14 Claims, 12 Drawing Sheets

Related U.S. Application Data

(60) Provisional application No. 62/441,579, filed on Jan. 3, 2017.

(51) Int. Cl.
  *H01L 25/16* (2006.01)
  *G06F 3/044* (2006.01)
  *G02F 1/1333* (2006.01)

(56) References Cited

U.S. PATENT DOCUMENTS

| | | | |
|---|---|---|---|
| 2015/0263300 A1* | 9/2015 | Namkung | G09F 9/00 257/40 |
| 2016/0181346 A1* | 6/2016 | Kwon | H01L 51/0097 257/40 |
| 2017/0125501 A1* | 5/2017 | Lim | H01L 27/3262 |
| 2017/0237025 A1* | 8/2017 | Choi | H01L 51/5253 257/40 |
| 2017/0357325 A1* | 12/2017 | Yang | G06F 3/0414 |
| 2018/0120997 A1* | 5/2018 | Moon | G06F 3/044 |
| 2018/0165996 A1* | 6/2018 | Ochi | H01L 51/50 |
| 2018/0240852 A1* | 8/2018 | Chen | H01L 27/3258 |

* cited by examiner

DISPLAY DEVICE WITH RECESSES

CROSS-REFERENCE TO RELATED APPLICATION

This is a continuation application of and claims the priority benefit of U.S. patent application Ser. No. 15/480,383, filed on Apr. 6, 2017, now pending, which claims the priority benefit of U.S. provisional application Ser. No. 62/441,579, filed on Jan. 3, 2017. The entirety of each of the above-mentioned patent applications is hereby incorporated by reference herein and made a part of this specification.

TECHNICAL FIELD

The disclosure relates to a display device.

BACKGROUND

Nowadays, electronic devices such as cellular telephones, personal computers, digital cameras or other consumer electronic equipment, have gained widespread use. In the manufacturing process of conventional display devices for the electronic devices, after the formation of a display structure layer on a main substrate, the main substrate is cut to form a plurality of display devices. However, micro-cracks will be formed at edges of the substrate of the display devices. Once the micro-cracks spread to the area where the display structure layer locates on, the display structure layer will be destroyed. Moreover, if the display devices are adapted to be flexible, the spread of the micro-cracks will be more serious, and the endurability of the display devices is decreased significantly.

SUMMARY

The disclosure provides a display device with the plurality of recesses to stop the spread of the micro-cracks of the display device.

A display device according to an embodiment of the disclosure includes a substrate, a driving structure layer, a display structure layer and a touch layer. The substrate includes a bending area and a main area adjacent to the bending area. The driving structure layer is disposed on the substrate. The driving structure layer comprises an insulating structure, and the insulating structure comprises a plurality of recesses. The display structure layer is disposed on the driving structure layer. The touch layer is disposed on the driving structure layer. A portion of the touch layer is disposed on the bending area of the substrate. At least a part of the plurality of recesses is disposed on the bending area of the substrate.

A display device according to an embodiment of the disclosure includes a substrate, a driving structure layer, a display structure layer and a touch layer. The substrate includes a bending area and a main area adjacent to the bending area. The driving structure layer is disposed on the substrate. The driving structure layer comprises a crack stopper. The display structure layer is disposed on the driving structure layer. The touch layer is disposed on the driving structure layer. A portion of the touch layer is disposed on the bending area of the substrate. At least a part of the crack stopper is disposed on the bending area of the substrate.

Based on the above, in the disclosure, the driving structure layer includes a plurality of recesses. In this way, the spread of the micro-cracks may be mitigated, or the endurability of the display device may be improved.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
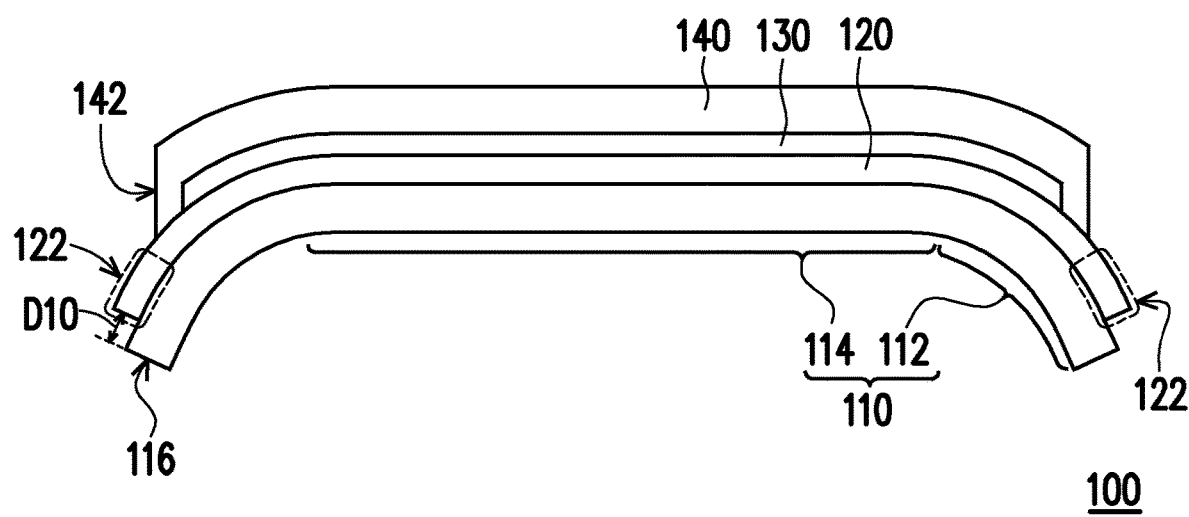
FIG. 1 is a schematic cross-sectional view of a display device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

The foregoing and other technical contents, features, and effects of the disclosure will be clearly described in the following detailed descriptions of the embodiments with reference to the accompanying drawings. The language used to describe the directions such as up, down, left, right, front, back or the like in the reference drawings is regarded in an illustrative rather than in a restrictive sense. Therefore, the directional wording is used to illustrate rather than limit the disclosure. For example, in the following descriptions, the description that a first object is on a second object covers the embodiment where the first object and the second object are in direct contact and the embodiment where the first object and the second object are not in direct contact. Besides, in the embodiment where the first object and the second object are not in direct contact, there may be another object or simply a space between the first object and the second object.

FIG. 1 is a schematic cross-sectional view of a display device according to an embodiment of the disclosure. Referring to FIG. 1, the display device 100 includes a substrate 110, a driving structure layer 120, a display structure layer 130 and a touch layer 140. The substrate 110 may be a flexible substrate or a rigid substrate. The flexible substrate can be made of plastic, and the rigid substrate can be made of glass, which is not limited. The substrate 110 has a bending area 112 and a main area 114 adjacent to the bending area 112. The bending area 112 can be considered as a bent portion of the substrate 110, and the main area 114 can be considered as an unbent portion of the substrate 110. In some embodiments, the main area 114 can be flat. However, in other embodiments, the main area 114 can be not flat and include uneven or curved surface. The bending area 112 can have greater bending extent than the main area 114. In other words, a greatest curvature of the bending area 112 is greater than a greatest curvature of the main area 114.

The bending process can be conducted before the display device is presented to the consumers (or users). FIG. 1 shows the state of the display device, in which the substrate 110 has been bent. Alternatively, according to some embodiments, when a flexible substrate is used as the substrate, the bending process can be conducted by the consumer. That is, originally, the substrate of the display device can be flat, and then the consumer can bend the substrate to have the bending area according to requirement, thus obtaining the display device as shown in FIG. 1. In the present disclosure, the bending area can mean a portion that has been bent, or a portion that will be bent by the consumers.

The driving structure layer 120 is disposed on the substrate 110. The driving structure layer 120 comprises an insulating structure. The insulating structure includes a plurality of recesses 122. The plurality of recesses 122 could act as a crack stopper. The recess can be in the form of opening or slit. The display structure layer 130 is disposed on the driving structure layer 120. The touch layer 140 is disposed on the driving structure layer 120. A portion of the touch layer 140 is disposed on the bending area 112 of the substrate 110. At least a part of the plurality of recesses 122 is disposed on the bending area 112 of the substrate 110.

Since the driving structure layer 120 includes the plurality of recesses 122 disposed on the bending area 112 of the substrate 110, even though the micro-cracks might exist at the edge of the substrate 110 and/or the edge of the driving structure layer 120, the spread of the micro-cracks can be stopped by the plurality of recesses 122. In this way, the spread of the micro-cracks may be mitigated, or yield of the substrate 110, the driving structure layer 120, the display structure layer 130 and the touch layer 140 can in increased, or the endurability of the display device may be improved. Meanwhile, it may be unnecessary to worry about the repeatedly bending will cause the spread of the micro-cracks on the display device 100.

The driving structure layer 120 may comprise driving circuits and driving elements constituted from a plurality of insulating layers and conductive layers, which is not limited thereto. The display structure layer 130 may comprises a plurality of organic light emitting diode (OLED) components, a plurality of micro-LED or other suitable display structure, which is not limited thereto. The touch layer 140 may comprises a plurality of insulating layers and conductive layers, which is not limited thereto. The driving structure layer 120, a display structure layer 130 and a touch layer 140 may not be separated clearly. For example, in some embodiment, portion of the touch layer 140 may be between the driving structure layer 120 and the display structure layer 130, and another portion of the touch layer 140 is located on the display structure layer 130. The bending area 112 of the substrate 110 is a portion of the substrate 110 with curve surface. The bending area 112 could be at side of the substrate 110 as shown in FIG. 1. However, if the display device is designed to be foldable like a book, the bending area could be in the middle region of the substrate, which is not limited thereto. FIG. 1 is a schematic drawing for facilitating understanding of the present embodiment only.

Figure 2:
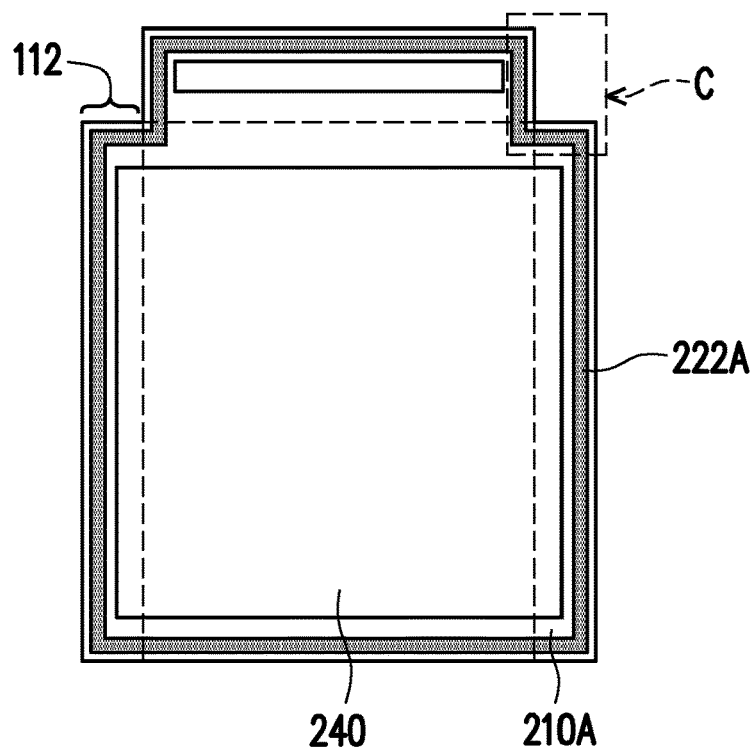
FIGS. 2-4 are schematic top views of display devices according to three embodiments of the disclosure.
Figure 3:
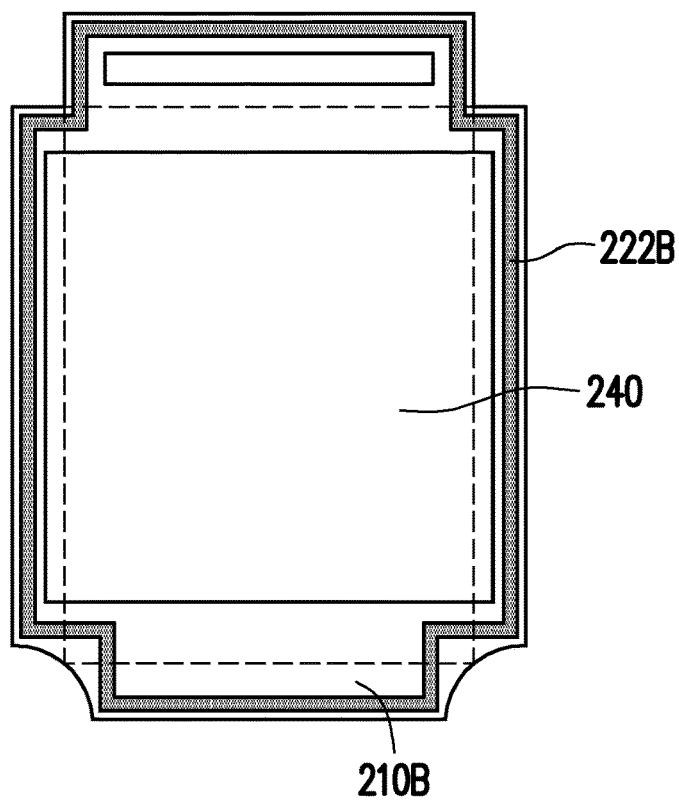
Figure 4:
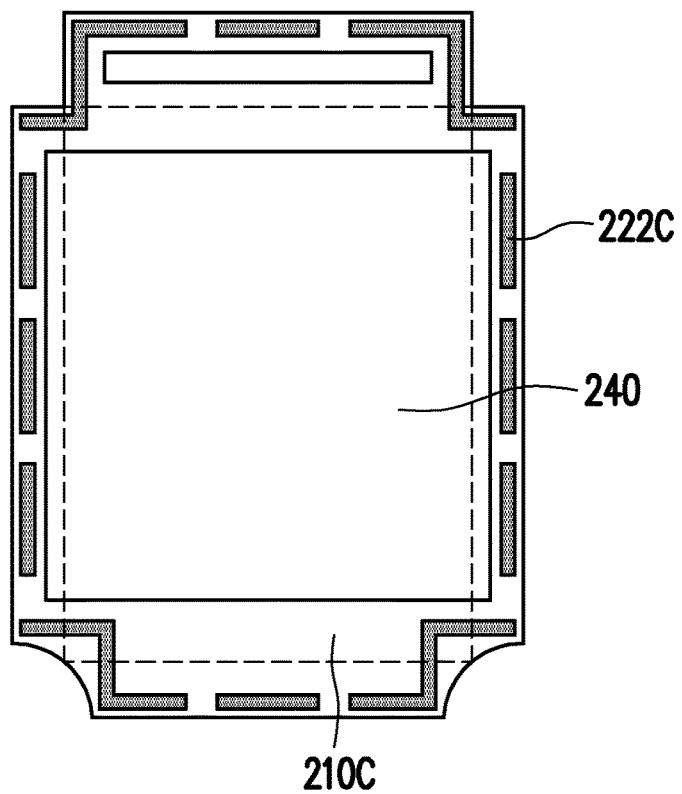
Figure 5:
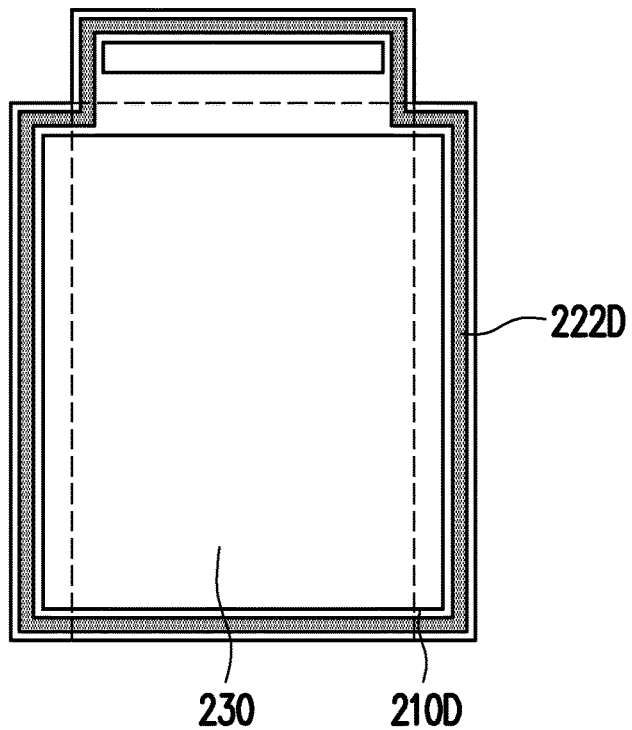
FIG. 5 is a schematic top views of display devices according to another embodiment of the disclosure.

FIGS. 2-4 are schematic top views of display devices according to three embodiments of the disclosure. The area filled with dots is the location of the plurality of recesses where the plurality of recesses is distributed. In the display devices of FIGS. 2-4, the distribution location of the plurality of recesses 222A, 222B and 222C surrounds the touch layer 240. The distribution location of the plurality of recesses 222A, 222B and 222C are located at edges of the substrates 210A, 210B and 210C. The distribution locations of the plurality of recesses 222A and 222B are continuous strip areas, and the distribution location of the plurality of recesses 222C is a discontinuous strip area, which is not limited thereto. The substrate 210A and the substrate 210B have different shapes, which is not limited thereto. FIG. 5 is a schematic top view of a display device according to another embodiment of the disclosure. In another aspect, the distribution location of the plurality of recesses 222D surrounds the display structure layer 230 as shown in FIG. 5. The substrates 210D and the substrates 210A have the same shapes. The display structure layer and the touch layer exist at the four embodiments of FIGS. 2-5, but only one of the display structure layer and the touch layer is shown in each embodiment. In FIGS. 2 to 5, the substrate (210A, 210B, 210C or 210D) can be bent in the position of the edge to form the bending area. For example, in FIG. 2, three dash lines are shown. The substrate 210A can be bent along at least one of the dash lines to form the bending area 112. Similarly, regarding the display devices shown in FIGS. 3 to 5, the substrate can be bent along at least one of the dash lines to form the bending area, which is not limited thereto.

Referring to FIG. 1, the substrate 110 further comprises a first edge 116, the touch layer 140 comprises a second edge 142 adjacent to the first edge 116, a part of the plurality of recesses 122 is disposed between the first edge 116 and the second edge 142. A minimum distance between the portion of the plurality of recesses 122 and the first edge 116 is a first distance D10, and the first distance D10 is between 0.1 um and 1000 um, which is not limited thereto. In the present embodiment, the display structure layer 130 is completely covered by the touch layer 140. Since the plurality of recesses 122 is disposed between the first edge 116 and the second edge 142, the plurality of recesses 122 locates outside the display structure layer 130. Therefore, the spread of the micro-cracks can be stopped by the plurality of recesses outside the display structure layer 130, and the display structure layer 130 can be kept away from the micro-cracks.

Figure 6:
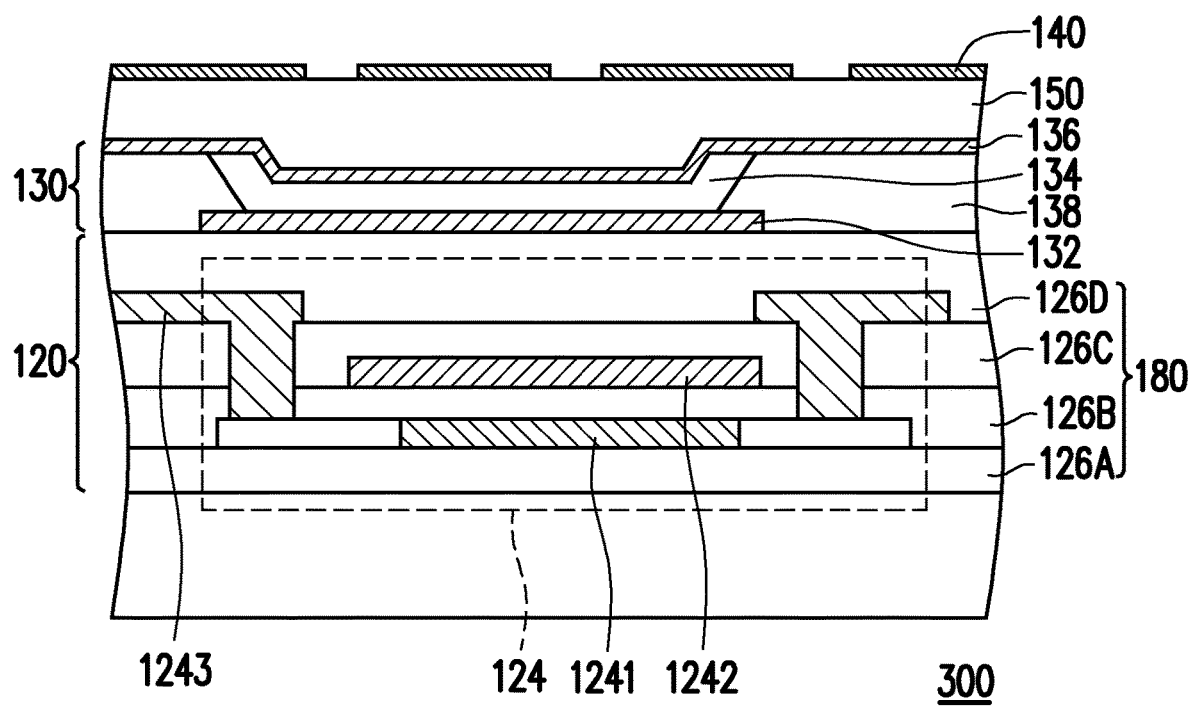
FIG. 6 is a schematic partially enlarged cross-sectional view of a display device according to an embodiment of the disclosure.

FIG. 6 is a schematic partially enlarged cross-sectional view of a display device according to an embodiment of the disclosure. Referring to FIG. 6, the display device 300 is similar to the display device 100 of FIG. 1, and the similar detail thereof is not repeated. A main difference therebetween is that the display device 300 further comprises a capping layer 150. The capping layer 150 is disposed between the display structure layer 130 and the touch layer 140. The capping layer 150 protects the display structure layer 130 and the driving structure layer 120 from the deterioration due to moisture penetration, the post-processes and the like. The capping layer 150 of the present embodiment also provides flat surface for disposing the touch layer 140. The capping layer 150 may comprise a plurality of stacked layer, and the plurality of stacked layer may comprise inorganic layers and organic layer(s) between the inorganic layers. The display structure layer 130 of the present embodiment includes a pixel electrode layer 132, a light-emitting layer 134 and a common electrode layer 136. A pixel defining layer 138 is disposed on the pixel electrode layer 132 and has an opening. The light-emitting layer 134 is disposed in the opening of the pixel defining layer 138 and between the pixel electrode layer 132 and the common electrode layer 136 to form light-emitting OLEDs for emitting light to constitute images for a user. The pixel electrode layer 132 can be an anode, and the common electrode layer 136 can be a cathode. Or, alternatively, the pixel electrode layer 132 can be a cathode, and the common electrode layer 136 can be an anode.

Referring to FIG. 6, the driving structure layer 120 can further include an insulating structure 180. The insulating structure 180 can includes a plurality of recesses 122 as shown in FIG. 1. In some embodiments, the insulating structure 180 can include at least one insulating layer. In some embodiments, the insulating structure 180 can include multiple insulating layers. The insulating layer can be a planarization layer, a gate insulating layer, a buffer layer, a passivation layer and so on, which is not limited thereto. Specifically, in some embodiments, the driving structure layer 120 includes a plurality of thin film transistor (TFT) 124, only one TFT 124 is shown in FIG. 6. The TFT 124 could electrically connect to the pixel electrode layer 132 and controls the light-emitting OLEDs. The TFT 124 can includes a buffer layer 126A, an active layer 1241, a gate layer 1242, a gate insulating layer 126B, a passivation layer 126C, a source/drain layer 1243, and a planarization layer 126D. The buffer layer 126A is disposed on the substrate 110 and between the substrate 110 and the active layer 1241. The gate insulating layer 126B is disposed between the active layer 1241 and the gate layer 1242. The passivation layer 126C covers the gate layer 1242, and the planarization layer 126D covers the source/drain layer 1243. Based on this TFT structure of FIG. 6, the insulating structure 180 can include at least one of the buffer layer 126A, the gate insulating layer 126B, the passivation layer 126C, and the planarization layer 126D, which is not limited thereto. For example, the insulating layer 180 includes only the buffer layer 126A, the gate insulating layer 126B, and the passivation layer 126C in another embodiment, which is not limited thereto.

Figure 7:
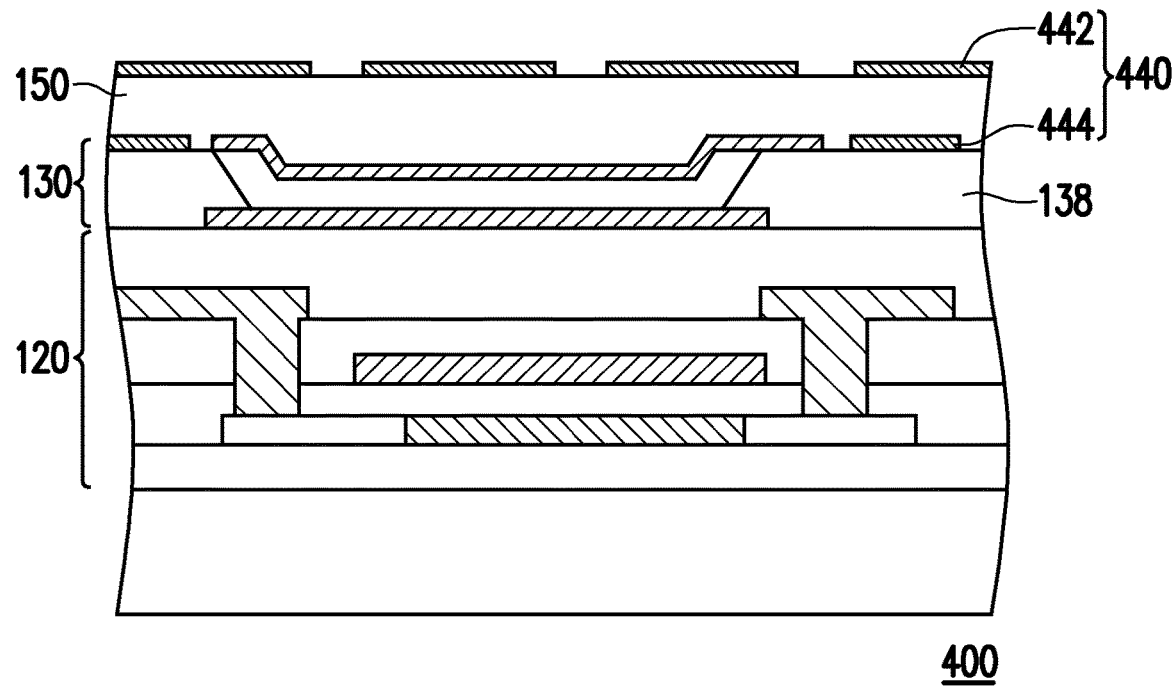
FIG. 7 is a schematic partially enlarged cross-sectional view of a display device according to an embodiment of the disclosure.

FIG. 7 is a schematic partially enlarged cross-sectional view of a display device according to an embodiment of the disclosure. Referring to FIG. 7, the display device 400 is similar to the display device 300 of FIG. 6, and the similar detail thereof is not repeated. A main difference therebetween is that the touch layer 440 of the display device 400 includes an upper touch electrode layer 442 and a lower touch electrode layer 444. The upper touch electrode layer 442 is disposed on the capping layer 150, and the lower touch electrode layer 444 is disposed between the display structure layer 130 and the capping layer 150. The lower touch electrode layer 444 and the common electrode layer 136 can be the same layer, and can be made of the same material. Specifically, first, an electrode layer can be formed, and then patterned by photolithography to form the lower touch electrode layer 444 and the common electrode layer 136.

Figure 8:
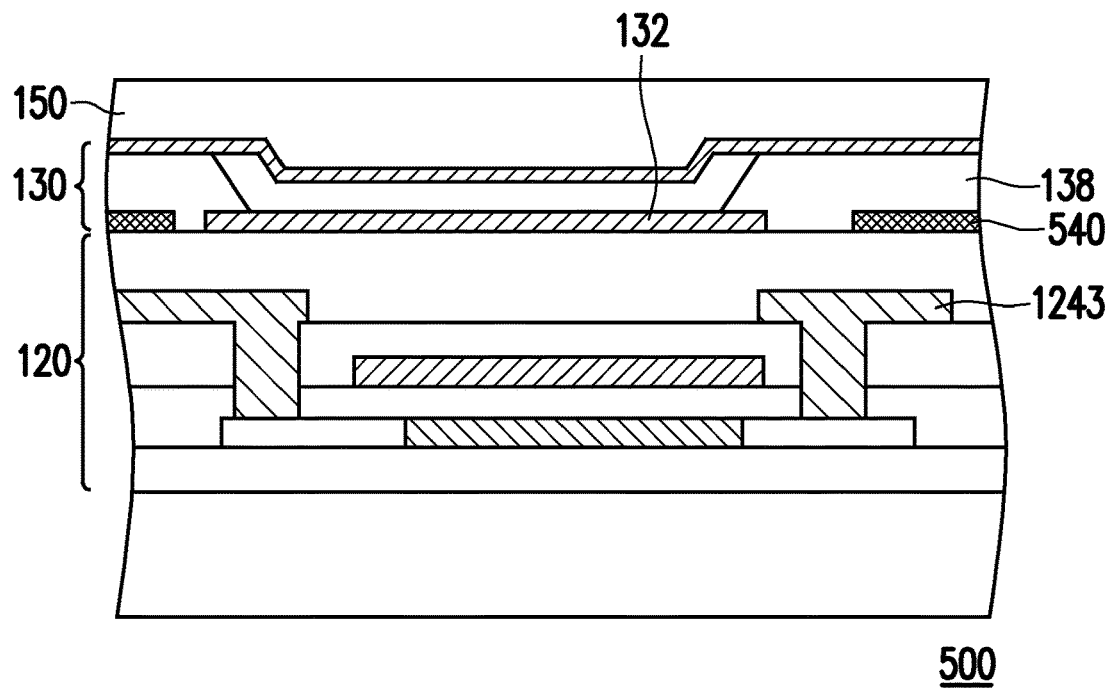
FIG. 8 is a schematic partially enlarged cross-sectional view of a display device according to an embodiment of the disclosure.

FIG. 8 is a schematic partially enlarged cross-sectional view of a display device according to an embodiment of the disclosure. Referring to FIG. 8, the display device 500 is similar to the display device 300 of FIG. 6, and the similar detail thereof is not repeated. A main difference therebetween is that the touch layer 540 of the display device 500 is disposed between the display structure layer 130 and the driving structure layer 120. The touch layer 540 and the pixel electrode layer 132 can be the same layer, and can be made of the same material. Specifically, first, an electrode layer can be formed, and then patterned by photolithography to form the touch layer 540 and the pixel electrode layer 132. Or, alternatively, the touch layer 540 can be the same layer and be made of the same material as the source/drain layer 1243.

Figure 9:
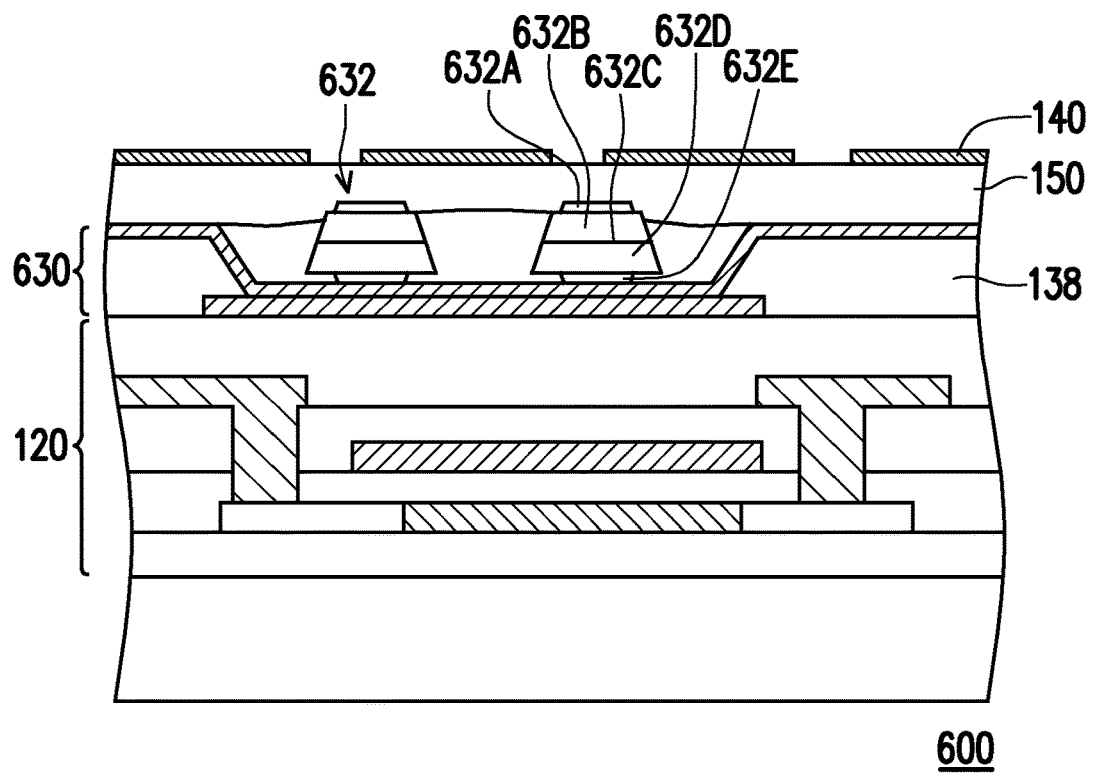
FIG. 9 is a schematic partially enlarged cross-sectional view of a display device according to an embodiment of the disclosure.

FIG. 9 is a schematic partially enlarged cross-sectional view of a display device according to an embodiment of the disclosure. Referring to FIG. 9, the display device 600 is similar to the display device 300 of FIG. 6, and the similar detail thereof is not repeated. A main difference therebetween is that the display structure layer 630 of the display device 600 includes a plurality of micro-LEDs 632. In the present embodiment, two micro-LEDs 632 can be disposed in one pixel. In another embodiment, only one micro-LED 632 can be disposed in one pixel, which is not limited thereto. Each of the micro-LEDs 632 includes a first electrode 632A, a first type doped semiconductor layer 632B, a quantum well layer 632C, a second type doped semiconductor layer 632D and a second electrode 632E. The first type doped semiconductor layer and the second type doped semiconductor layer can be of different doping types. For example, the first type can be N-doped, and the second type can be P-doped, and vice versa. The micro-LEDs 632 of the present embodiment are vertical LEDs for exemplary purposes. However, in other embodiments, flip-chip LEDs or other light emitting devices may also be adopted in the display structure layer 630. While bonding the micro-LEDs 632 onto the display device 600, the substrate 110 will be squeezed, and the possibility of the spread of the microcracks may increase. Therefore, the insulating structure 180 with the plurality of recesses 122 (shown in FIG. 1) is very important.

Figure 10:
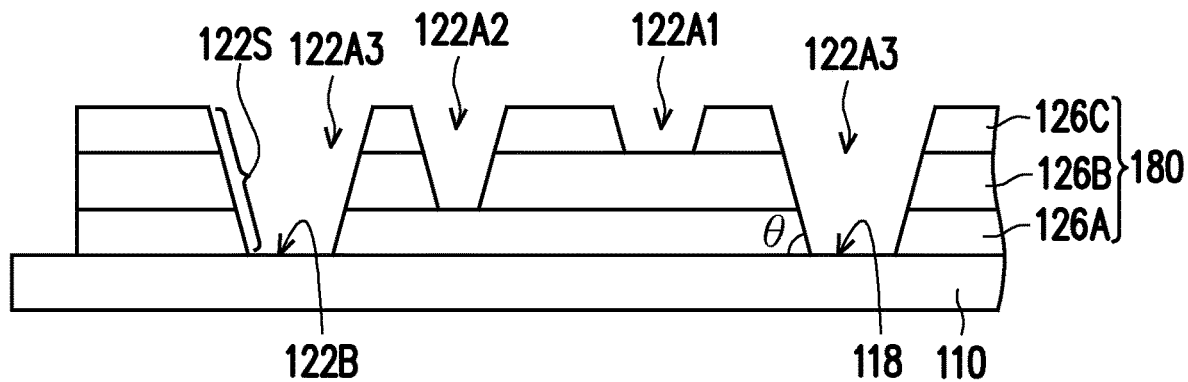
FIG. 10 is a schematic partially enlarged cross-sectional view of a plurality of recesses of a display device according to an embodiment of the disclosure.

FIG. 10 is a schematic partially enlarged cross-sectional view of an insulating structure with a plurality of recesses structure in the bending area of a display device according to an embodiment of the disclosure. As described above, the insulating structure 180 can include at least one insulating layer, or can include multiple insulating layer. When the insulating structure 180 includes multiple insulating layers, the plurality of recesses can have different depths. For example, in FIG. 10, the insulating structure 180 can include the buffer layer 126A, the gate insulating layer 126B, and the passivation layer 126C. The insulating structure 180 can include a plurality of recesses on the main area and on the bending area. FIG. 10 shows the part of the plurality of recesses on the bending area. Recesses 122A1, 122A2, and 122A3 are formed in the insulating structure 180. The recess 122A1 is formed in the passivation layer 126C, the recess 122A2 is formed in the passivation layer 126C and the gate insulating layer 126B. The recess 122A3 is formed in the passivation layer 126C, the gate insulating layer 126B, and the buffer layer 126A. The surface 118 of the substrate 110 is only exposed in some of the recesses, but the surface 118 is not exposed in other recesses. For example, as shown in FIG. 10, the surface 118 of the substrate 110 is exposed by the recess 122A3, but not exposed by the recess 122A1 and recess 122A2, which is not limited thereto.

Referring to FIG. 10, the insulating structure 180 includes recesses 122A1, 122A2, and 122A3 with different depths, which is not limited thereto. The recesses with different depths can stop the spread of the micro-cracks occur in different depths. Referring to FIG. 10, the recess 122A3 includes a sidewall 122S and a bottom 122B. The insulating structure 180 includes an angle θ formed by the sidewall 122S and the bottom 122B, and the angle θ can be between 10° and 80°. In the experiments, the probability of the spread of the micro-cracks is 23% when the taper angle θ is 90°, and the probabilities of the spread of the micro-cracks are 10%, 8%, 7%, 9% and 7% when the taper angle θ is 80°, 60°, 50°, 20° and 10°, respectively. In some embodiments, the taper angle θ can be between 10° to 80°. In some embodiments, the taper angle θ can be between 20° to 60°.

The sidewalls of the recesses included in the insulating structure 180 can be smooth or can have a step profile. For example, as shown in FIG. 10, the sidewalls of the recesses 122A1, 122A2, and 122A3 are smooth. However, the sidewalls 122B1 of the recess 122B as shown in FIG. 11 has a step 122B2, which is not limited thereto.

Figure 11:
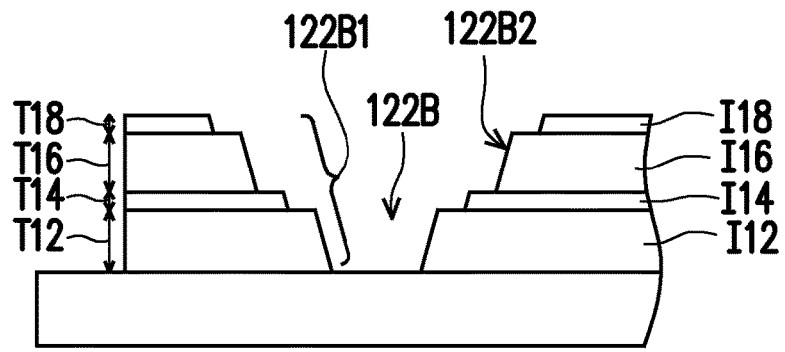
FIG. 11 is a schematic partially enlarged cross-sectional view of a plurality of recesses of a display device according to another embodiment of the disclosure.

Referring to the FIG. 11, the recess 122B is formed in the insulating structure 180. The insulating structure 180 can include stacked insulating layers including the first silicon oxide layer I12, the first silicon nitride layer I14, the second silicon oxide layer I16 and the second silicon nitride layer I18, which is not limited thereto. The total thickness of the silicon oxide layer (such as a sum of a thickness T12 of the first silicon oxide layer I12 and a thickness T16 of the second silicon oxide layer I16) may be larger than the total thickness of the silicon nitride layer (such as a sum of a thickness T14 of the first silicon nitride layer I14 and a thickness T18 of the second silicon nitride layer I18). For example, the total thickness of the silicon oxide layer may be 1.5 times larger than the total thickness of the silicon nitride layer, and the total thickness of the silicon oxide layer may be smaller than 15 times of the total thickness of the silicon nitride layer.

Figure 12:
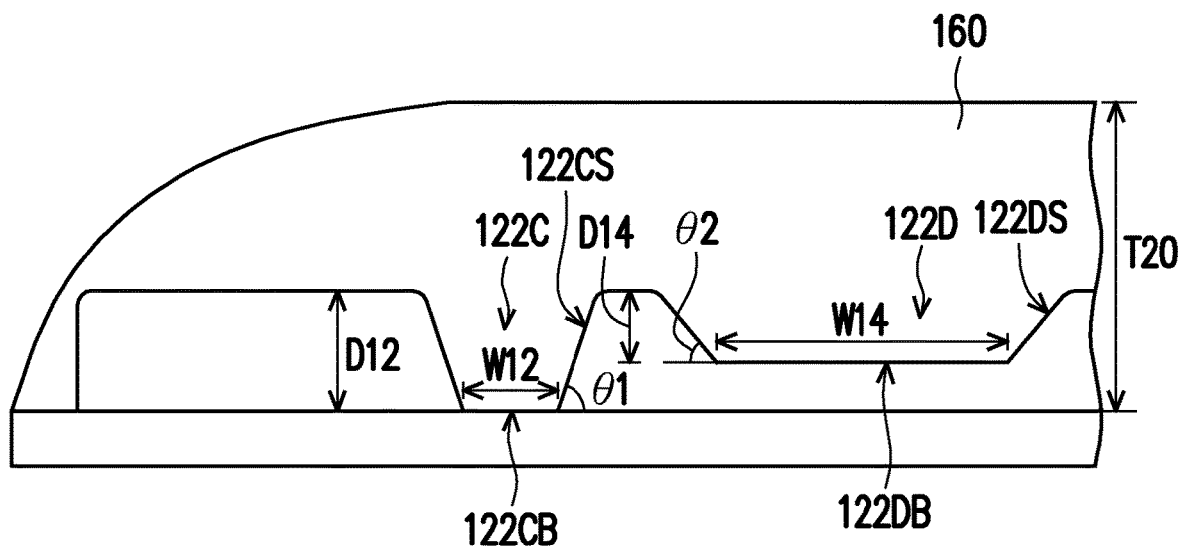
FIG. 12 is a schematic partially enlarged cross-sectional view of a plurality of recesses of a display device according to an embodiment of the disclosure.

FIG. 12 is a schematic partially enlarged cross-sectional view of an insulating structure with a plurality of recesses structure in the bending area of a display device according to an embodiment of the disclosure. The insulating structure 180 can include a plurality of recesses on the main area and on the bending area. FIG. 12 shows the part of the plurality of recesses on the bending area. Referring to FIG. 12, the insulating structure 180 comprises a first recess 122C and a second recess 122D. A minimum width of the first recess 122C is a first width W12, a minimum width of the second recess 122D is a second width W14, and the first width W12 is different from the second width W14, which is not limited thereto.

The first recess 122C has a first depth D12, the second recess 122D has a second depth D14, and the first depth D12 is different from the second depth D14. Therefore, the spread of the micro-cracks occur in different depths can be stopped. The first recess 122C includes a first sidewall 122CS and a first bottom 122CB, and the second recess 122D includes a second sidewall 122DS and a second bottom 122DB. The insulating structure 180 includes a first angle θ1 formed by the first sidewall 122CS and the first bottom 122CB, and a second angle θ2 formed by the second sidewall 122DS and the second bottom 122DB. The first angle θ1 and the second angle θ2 can be in the range of 10° to 80°, for example, in the range of 20° to 60°. The first angle θ1 and the second angle θ2 can be the same or different. The quotient obtained by dividing the first angle θ1 by the second angle θ2 may be smaller than 1.5 and larger than 0.8. The corner at the top of the first recess 122C may have a smooth profile as shown in FIG. 12. Therefore, the mitigation effect of the spread of the micro-cracks can be further enhanced.

In some embodiments, the display device of the present embodiment may further comprise an organic layer 160 that covers the first recess 122C and the second recess 122D of the plurality of recesses. In some embodiments, the organic layer 160 can be formed by the same fabricating process of the organic layer of the capping layer 150 or other layers as shown in FIG. 6, but the organic layer 160 can be a layer different from the layers shown in FIG. 6, which is not limited thereto. Or, in some embodiments, the organic layer 160 can be the same layer of the pixel defining layer 138 of the display structure layer 130. The organic layer 160 can mitigate the stress concentration occurred at the plurality of recesses, and the spread of the micro-cracks may be mitigated. The thickness T20 of the organic layer 160 is larger than both the first depth D12 of the first recess 122C and the second depth D14 of the second recess 122D. The thickness T20 of the organic layer 160 may be 1.5 times larger than both the first depth D12 of the first recess 122C and the second depth D14 of second recess 122D.

Figure 13A:
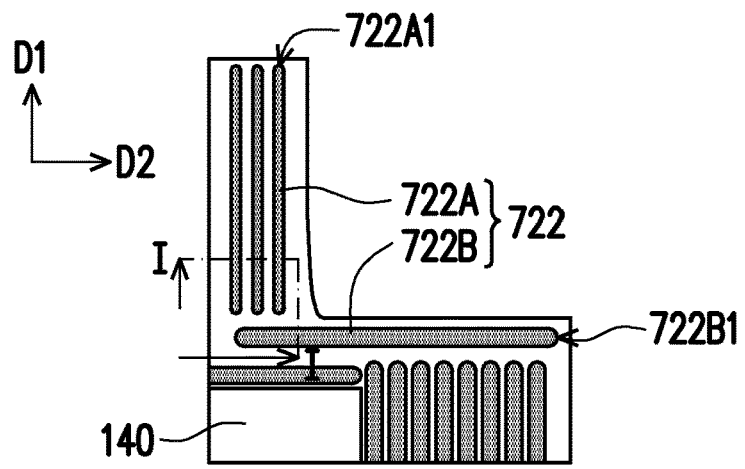
FIGS. 13A to 13E are schematic partially enlarged top views of the corners of the display device according to five embodiments of the disclosure.

FIGS. 13A to 13E are schematic partially enlarged top views of the corners of the display device according to five embodiments of the disclosure. For example, the corners shown in FIGS. 13A to 13E can show the area C in FIG. 2. FIGS. 13A to 13E are shown in microscopic viewpoint, and FIGS. 2-5 are shown in macroscopic viewpoint. A plurality of recesses similar as that of FIGS. 13A to 13E may be distributed in the areas filled with dots shown in FIGS. 2-5. Referring to FIG. 13A, in the part of the plurality of recesses on the bending area, the plurality of recesses 722 comprises at least one first recess 722A and at least one second recess 722B. A plurality of first recesses 722A and a plurality of second recesses 722B can be disposed in the insulating structure 180 in the present embodiment, which is not limited thereto. The first recesses 722A are extending along a first direction D1, the second recesses 722B are extending along a second direction D2, and the first direction D1 is different from the second direction D2. The first direction D1 may be perpendicular to the second direction D2, which is not limited thereto. The first recesses 722A and the second recesses 722B can be disposed on the bending area. The first recesses 722A and the second recesses 722B extending along different directions can stop the spread of the micro-cracks occur in different direction. Meanwhile, the first recesses 722A and the second recesses 722B may have arc-shaped edged 722A1 and 722B1 for reducing the cusp angles to mitigate the occurrence of the micro-cracks at the cusp angles, which is not limited thereto.

Figure 14:
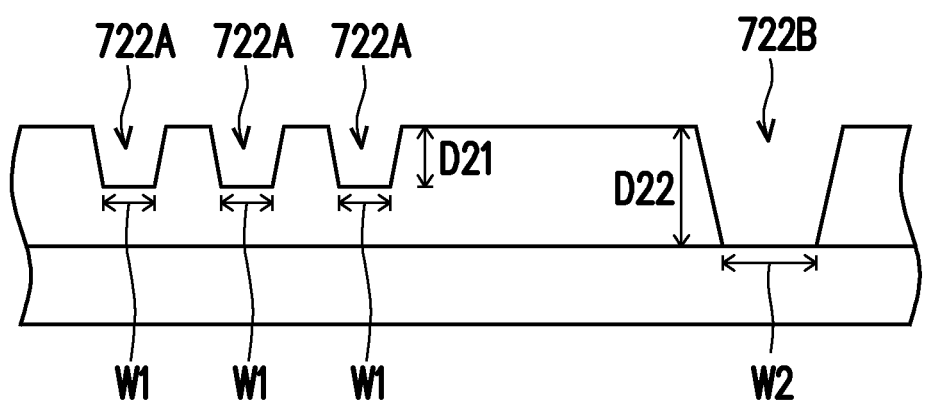
FIG. 14 is a schematic cross-sectional view of FIG. 13A along I-I line.

According some embodiments, the recesses in the insulating structure can be of various depths, and can be of various widths. For example, referring to FIG. 13A and FIG. 14, a minimum width of the first recess 722A is a first width W1, a minimum width of the second recess 722B is a second width W2, and the first width W1 can be different from the second width W2. In addition, the first recess 722A has a first depth D21, the second recess 722B1 has a second depth D22, and the first depth D21 can be different from the second depth D22.

Figure 13B:
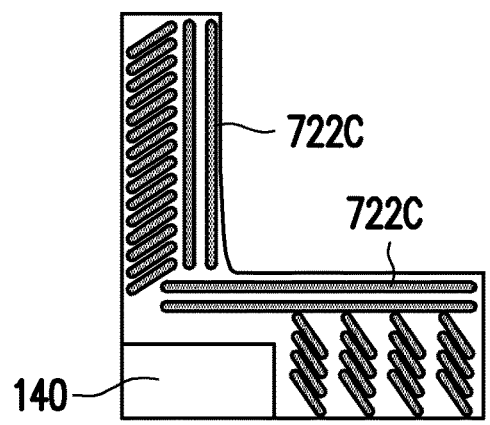
Figure 13C:
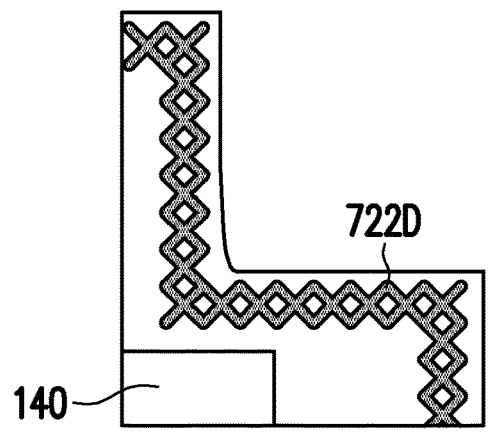
Figure 13D:
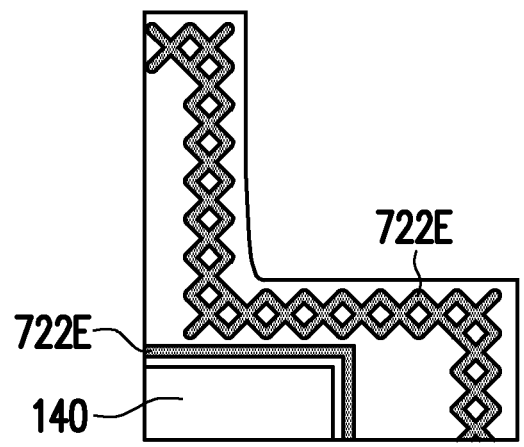
Figure 13E:
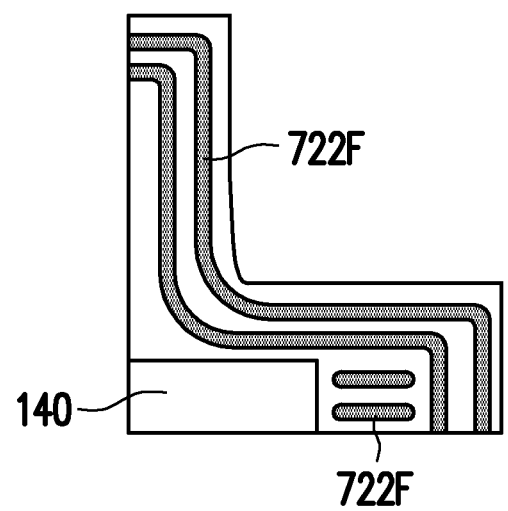

Referring to FIG. 13B, the plurality of recesses comprises recesses 722C extend along four different directions. Referring to FIG. 13C, the plurality of recesses comprises recesses 722D having continuous crisscross-shapes. Referring to FIG. 13D, the plurality of recesses comprises recesses 722E having continuous crisscross-shapes and straight shapes. Referring to FIG. 13E, the plurality of recesses comprises recesses 722F having curve shapes and straight shapes.

Figure 15A:
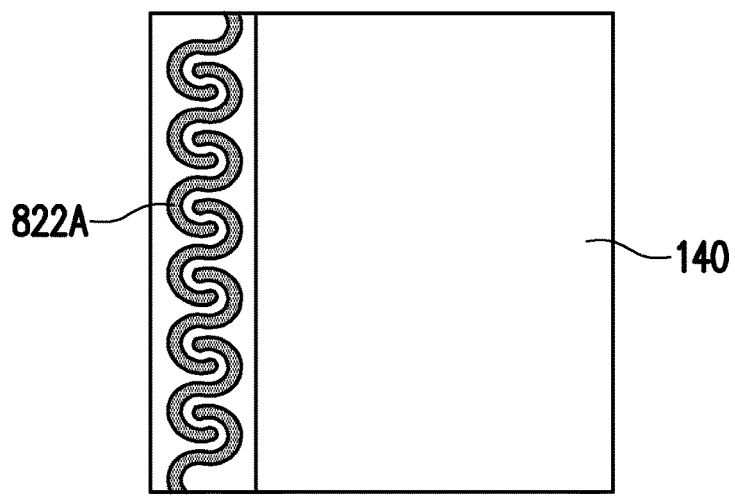
FIGS. 15A to 15H are schematic partially enlarged top views of the straight edge of the display device according to eight embodiments of the disclosure.
Figure 15B:
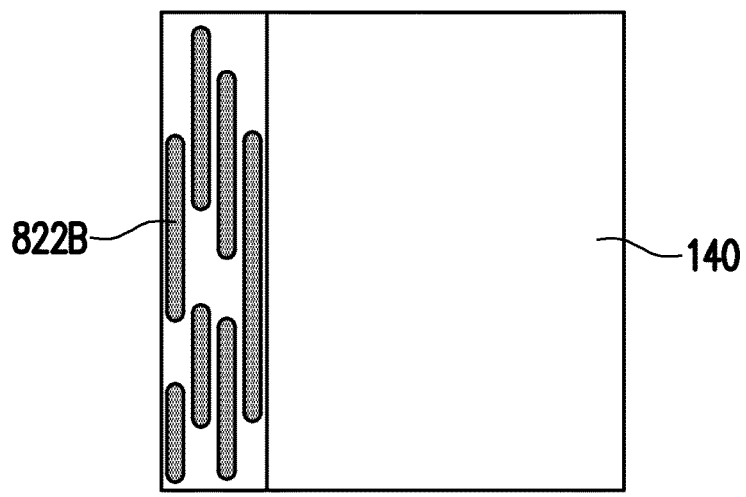
Figure 15C:
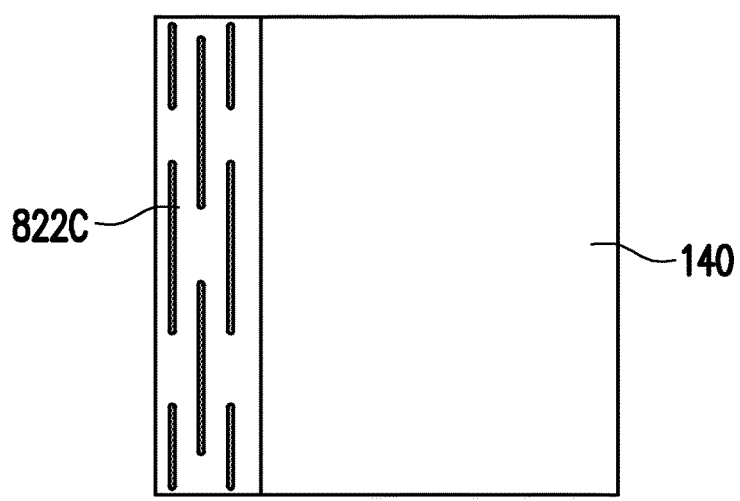
Figure 15D:
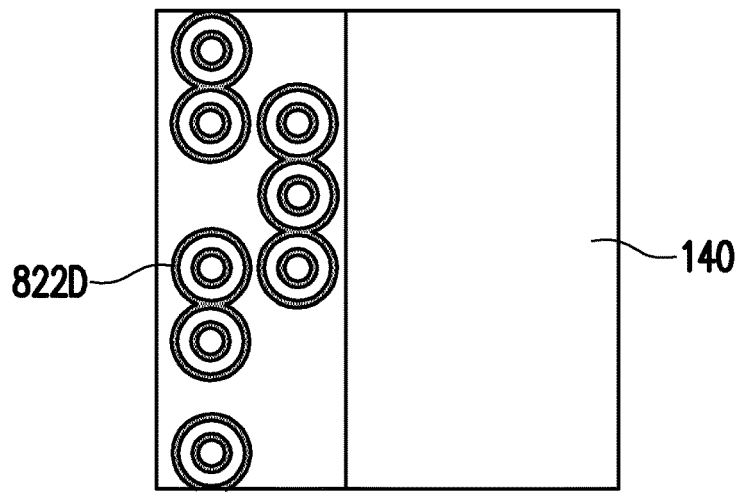
Figure 15E:
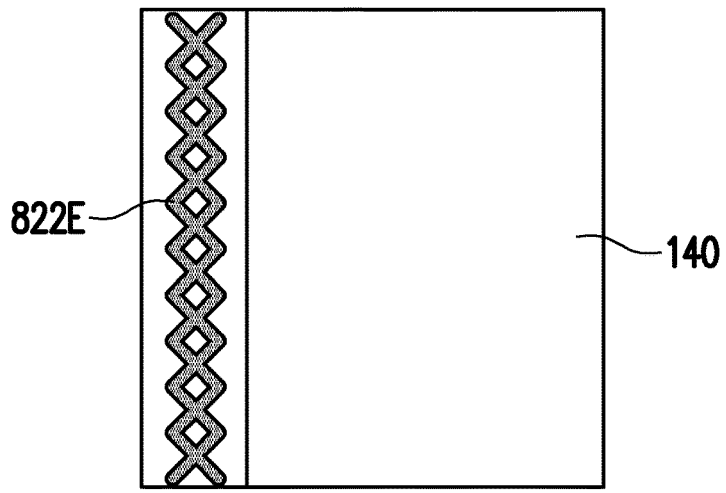
Figure 15F:
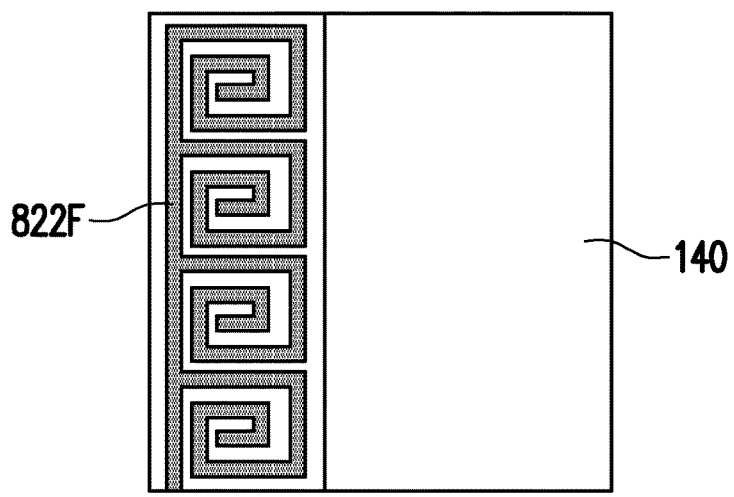
Figure 15G:
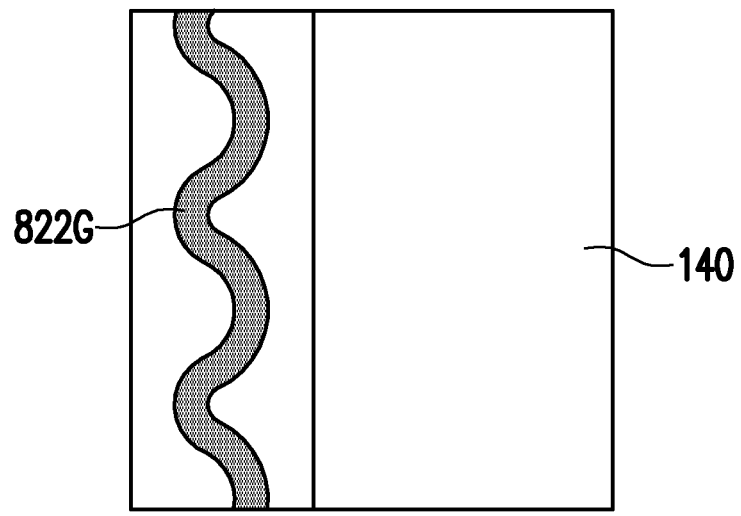
Figure 15H:
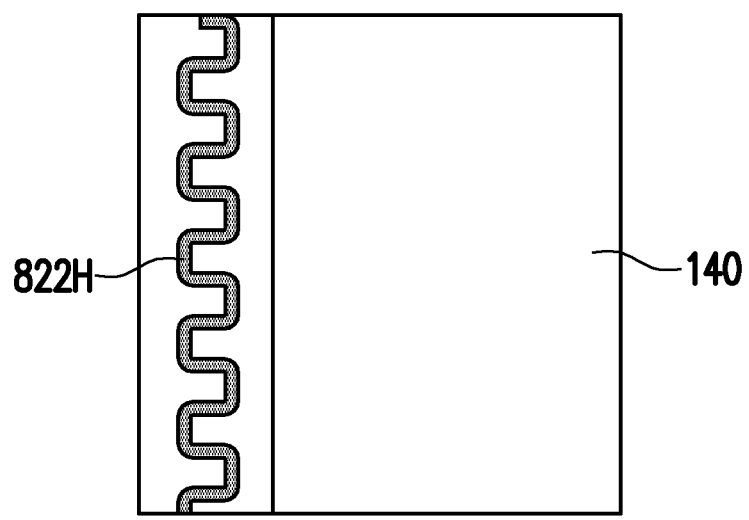

FIGS. 15A to 15H are schematic partially enlarged top views of the straight edge of the display device according to eight embodiments of the disclosure. Referring to FIG. 15A, the plurality of recesses comprises a chain of recesses 822A having S-shapes. Referring to FIG. 15B, the plurality of recesses comprises a plurality of recesses 822B having wider straight shapes. Referring to FIG. 15C, the plurality of recesses comprises a plurality of recesses 822C having thinner straight shapes. Referring to FIG. 15D, the plurality of recesses comprises a plurality of recesses 822D having circle shapes. Referring to FIG. 15E, the plurality of recesses comprises a plurality of recesses 822E having continuous crisscross-shapes. Referring to FIG. 15F, the plurality of recesses comprises a plurality of recesses 822F having spiral-shapes. Referring to FIG. 15G, the plurality of recesses comprises a plurality of recesses 822G having continuous S-shapes with wider pitch. Referring to FIG. 15H, the plurality of recesses comprises a plurality of recesses 822H having continuous S-shapes with narrow pitch.

In view of the foregoing, in the display device according to the embodiments of the disclosure, the micro-cracks would not spread to the display area of the display device owing to the plurality of recesses of the driving structure layer. The mitigating effect for the spread of the micro-cracks is more significant for the foldable display device. The display device of the disclosure has batter reliability or the display quality can be kept well.

It will be apparent to those skilled in the art that various modifications and variations can be made to the structure of the disclosure without departing from the scope or spirit of the disclosure. In view of the foregoing, it is intended that the disclosure covers modifications and variations of the disclosure provided they fall within the scope of the following claims and their equivalents.

What is claimed is:

1. A display device, comprising:
   a substrate, comprising a bending area, a main area adjacent to the bending area, and a first edge;
   a driving structure layer, disposed on the substrate, wherein the driving structure layer comprises an insulating structure, and the insulating structure comprises a plurality of recesses, and the first edge of the substrate is outside the driving structure layer;
   a display structure layer, disposed on the driving structure layer; and
   a touch layer, disposed on the driving structure layer, wherein a portion of the touch layer is disposed on the bending area of the substrate,
   wherein at least a part of the plurality of recesses is disposed on the bending area of the substrate,
   wherein a minimum distance between an edge of the plurality of recesses and the first edge is a first distance, the first distance is greater than or equal to 10 um and less than or equal to 140 um, and each corner at the top of the at least a part of the plurality of recesses has a smooth profile.

2. The display device of claim 1, wherein the plurality of recesses is disposed around the touch layer.

3. The display device of claim 1, wherein the plurality of recesses is disposed around the display structure layer.

4. The display device of claim 1, wherein the touch layer comprises a second edge adjacent to the first edge, the at least a part of the plurality of recesses is disposed between the first edge and the second edge.

5. The display device of claim 1, wherein the plurality of recesses comprises a first recess and a second recess, the first recess is extending along a first direction, the second recess is extending along a second direction, and the first direction is different from the second direction.

6. The display device of claim 5, wherein the first recess has a first depth, the second recess has a second depth, and the first depth is different from the second depth.

7. The display device of claim 5, wherein a minimum width of the first recess is a first width, a minimum width of the second recess is a second width, and the first width is different from the second width.

8. The display device of claim 1, further comprising a capping layer, wherein the capping layer is disposed between the display structure layer and the touch layer.

9. The display device of claim 1, wherein the touch layer is disposed between the display structure layer and the driving structure layer.

10. The display device of claim 1, wherein the plurality of recesses comprises a first recess, the first recess includes a first sidewall and a first bottom, the insulating structure includes a first angle formed by the first sidewall and the first bottom, and the first angle is between 10° and 80°.

11. The display device of claim 10, wherein the plurality of recesses further comprises a second recess, the second recess includes a second sidewall and a second bottom, the insulating structure further includes a second angle formed by the second sidewall and the second bottom, and the first angle is different from the second angle.

12. The display device of claim 1, further comprising an organic layer covering the plurality of recesses.

13. The display device of claim 1, wherein the driving structure layer includes an active layer, a gate layer, a gate insulating layer disposed between the active layer and the gate layer, and a passivation layer covering the gate layer, and wherein the insulating structure includes the gate insulating layer and the passivation layer.

14. A display device, comprising:
   a substrate, comprising a bending area, a main area adjacent to the bending area, and a first edge;
   a driving structure layer, disposed on the substrate, wherein the driving structure layer comprises a crack stopper, and the first edge of the substrate is outside the driving structure layer;
   a display structure layer, disposed on the driving structure layer; and
   a touch layer, disposed on the driving structure layer, wherein a portion of the touch layer is disposed on the bending area of the substrate,
   wherein at least a part of the crack stopper is disposed on the bending area of the substrate,
   wherein a minimum distance between an edge of the crack stopper and the first edge is a first distance, the first distance is greater than or equal to 10 um and less than or equal to 140 um, and each corner at the top of the at least a part of the crack stopper has a smooth profile.

* * * * *